United States Patent
Kuan

(10) Patent No.: US 8,391,003 B2
(45) Date of Patent: Mar. 5, 2013

(54) ELECTRONIC DEVICE WITH LOCKING ASSEMBLY

(75) Inventor: Chang-Ming Kuan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 221 days.

(21) Appl. No.: 13/052,126

(22) Filed: Mar. 21, 2011

(65) Prior Publication Data

US 2012/0014045 A1    Jan. 19, 2012

(30) Foreign Application Priority Data

Jul. 14, 2010   (CN) ...................... 2010 2 0258053 U

(51) Int. Cl.
*G06F 1/16* (2006.01)

(52) U.S. Cl. ......... 361/679.57; 361/679.01; 361/679.02; 361/679.58; 312/223.1; 312/223.2

(58) Field of Classification Search ............. 361/679.57, 361/679.58

See application file for complete search history.

(56) References Cited

U.S. PATENT DOCUMENTS

| 7,758,133 | B2 * | 7/2010 | Chen et al. ................. 312/223.2 |
| 8,081,451 | B1 * | 12/2011 | Chen ......................... 361/679.57 |
| 2011/0110032 | A1 * | 5/2011 | Kuo et al. ................ 361/679.58 |

* cited by examiner

*Primary Examiner* — Anthony Q Edwards
(74) *Attorney, Agent, or Firm* — Altis Law Group, Inc.

(57) ABSTRACT

An electronic device includes an enclosure and a locking assembly. The enclosure includes a bottom wall defining a pair of receiving portions and a sidewall defining a through hole. The locking assembly includes an operating wheel, a sliding part, and a resilient member. The operating wheel pivotally connects to the bottom wall and includes an operating portion passing through the through hole and exposed outside the enclosure and a securing portion adjacent to a rim of the operating wheel and received in the enclosure. The sliding part is movably attached to the bottom wall and defines a receiving groove engaging with the securing portion and a pair of openings adjacent to the pair of receiving portions respectively. The resilient member is fixed between the bottom wall and the operating wheel.

10 Claims, 4 Drawing Sheets

ELECTRONIC DEVICE WITH LOCKING ASSEMBLY

BACKGROUND

1. Technical Field

The present disclosure relates to electronic devices, and more particularly to a locking assembly of an electronic device.

2. Description of Related Art

Many electronic devices, such as IP phones, or LCD TVs, are mounted on walls by use of bolts or other fasteners. Generally, these electronic devices are configured with a groove to receive the bolts or fasteners. However, the electronic devices are not always configured with a structure to lock or secure the electronic device to the fastener. The lack of such structure can lead to potential disengagement of the electronic device from the fastener, and correspondingly result in damage to the electronic device.

Therefore, there is room for improvement within the art.

DETAILED DESCRIPTION

Figure 1:
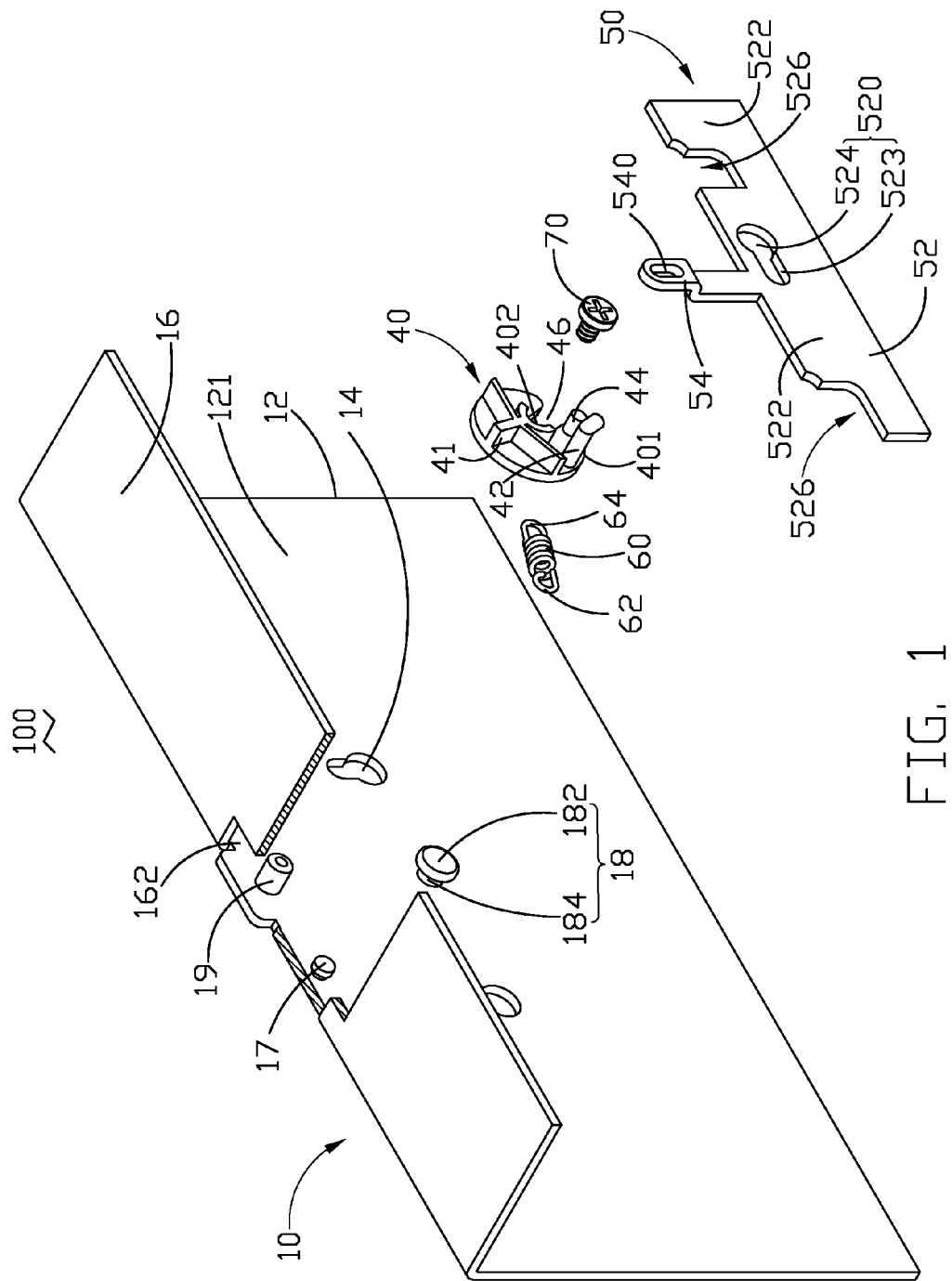
FIG. 1 is an exploded, isometric view of an electronic device of an exemplary embodiment of the disclosure.
Figure 2:
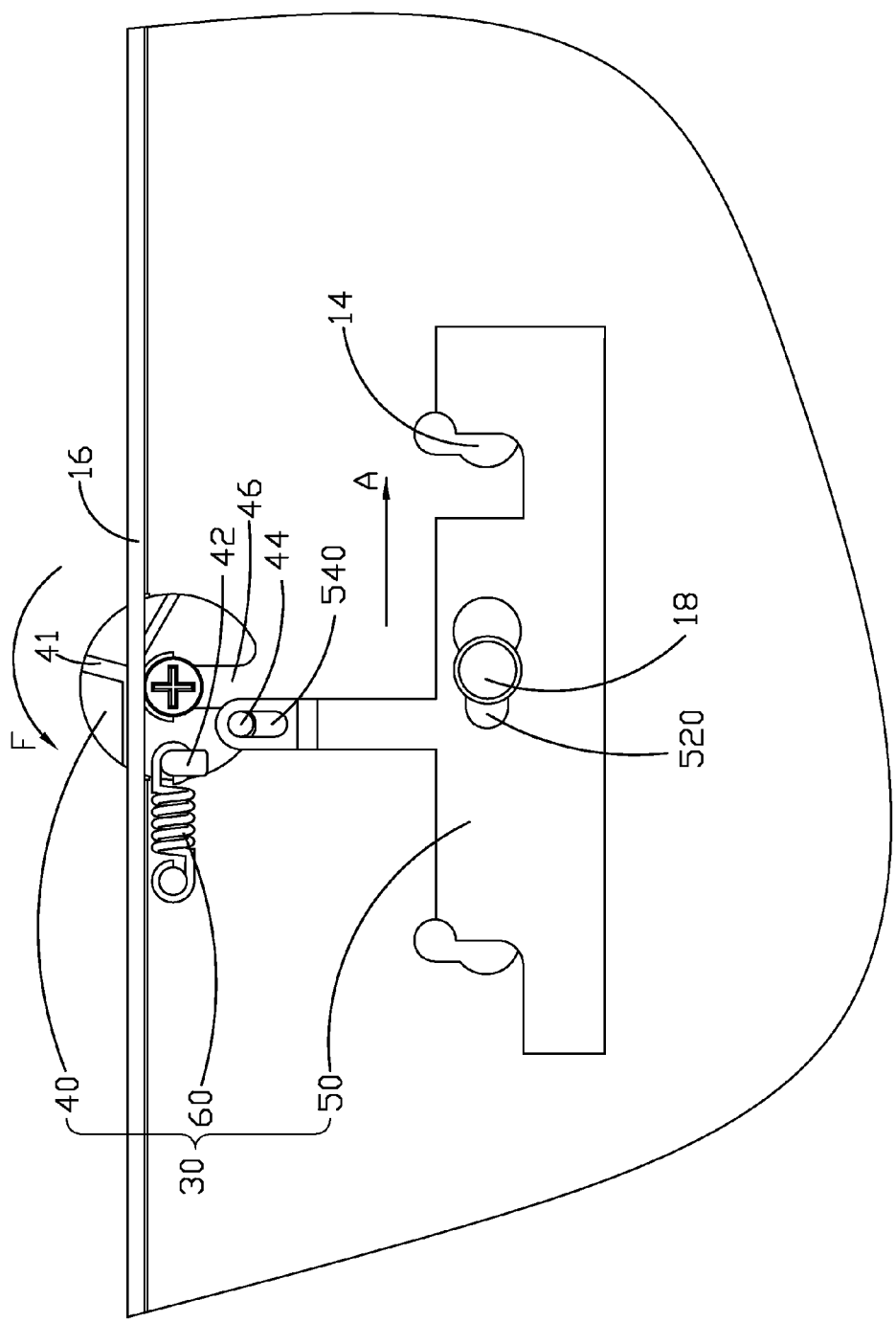
FIG. 2 is an assembled view of FIG. 1, showing the electronic device in a lockable position.
Figure 3:
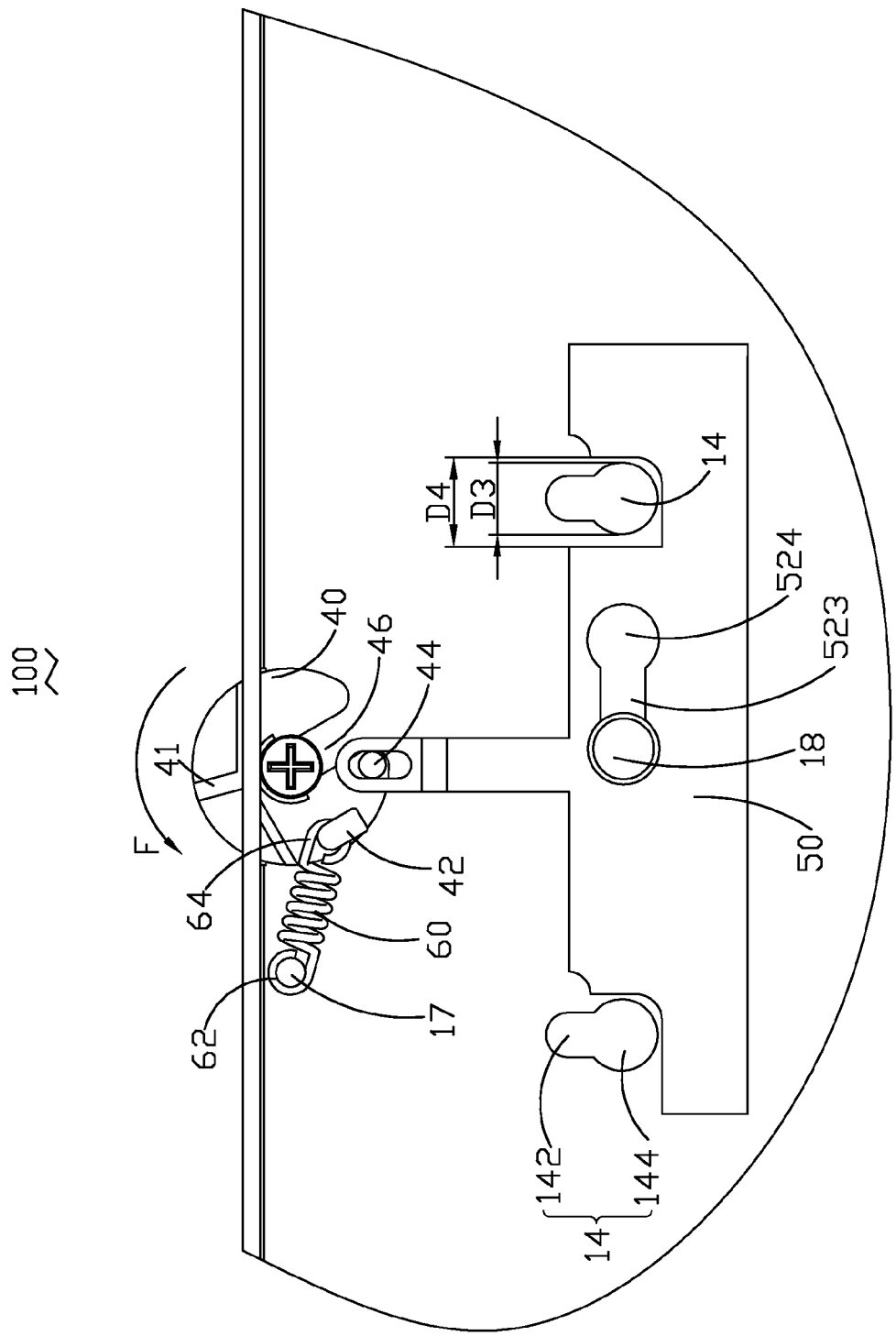
FIG. 3 is an assembled view of FIG. 1, showing the electronic device in an unlockable position.

Referring to FIGS. 1-3, a portion of an electronic device 100 of an exemplary embodiment of the present disclosure is illustrated. The electronic device 100 includes an enclosure 10 and a locking assembly 30. The electronic device 100 may be, but not limited to, a phone, a router, a switch, or an LCD TV, for example.

Figure 4:
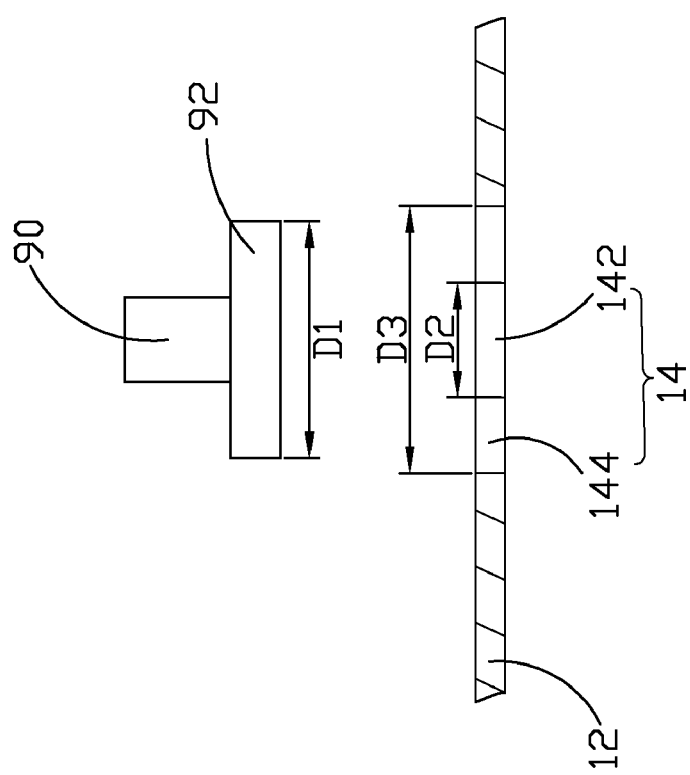
FIG. 4 is a schematic, exploded view of part of an enclosure with a receiving portion and a fastener.

The enclosure 10 accommodates electronic components, such as printed circuit boards (PCBs) and/or hard disc drives (HDDs). Although the illustrated embodiment shows the enclosure 10 being substantially rectangular, other configurations, shapes, or structures may be utilized. In this exemplary embodiment, the enclosure 10 includes a bottom wall 12 and a plurality of sidewalls 16 (only one is shown in FIG. 1). The bottom wall 12 defines a pair of receiving portions 14. One of the sidewalls 16 defines a through hole 162. In this exemplary embodiment, each of the receiving portions 14 includes a first receiving hole 142 and a second receiving hole 144 in communication with the first receiving hole 142. Referring to FIG. 4, the diameter D1 of a head 92 of a fastener 90 is greater than the width D2 of the first receiving hole 142, as well as less than the width D3 of the second receiving hole 144.

The locking assembly 30 is attached to the bottom wall 12 of the enclosure 10 and used to prevent the enclosure 10 from disengaging from the fastener 90. The locking assembly 30 includes an operating wheel 40, a sliding part 50 and a resilient member 60.

The operating wheel 40 pivotally connects to an inner surface 121 of the bottom wall 12, and comprises an operating portion 41 and a securing portion 44. The securing portion 44 adjacent to a rim 401 of the operating wheel 40 is received in the enclosure 10 to engage with the sliding part 50. The operating portion 41 passes through the through hole 162 and exposed outside the enclosure 10 for user operations. In this embodiment, the bottom wall 12 comprises a protruding rod 19 perpendicularly extending from the inner surface 121. The operating wheel 40 defines a center through hole 402 and a passing groove 46 extending from the center through hole 402 to the rim 401 of the operating wheel 40. The protruding rod 19 can pass through the passing groove 46 and be positioned in the center through hole 402. In this embodiment, the protruding rod 19 engages with a screw 70 to position the operating wheel 40 at the center through hole 402. The securing portion 44 is adjacent to the passing groove 46.

The sliding part 50 is movably attached to the bottom wall 12 and defines a receiving groove 540 engaging with the securing portion 44 and a pair of openings 526 adjacent to the pair of receiving portions 14 respectively. The receiving groove 540 is an elongated shape and slidably receives the securing portion 44. When the operating wheel 40 is driven to rotate, the securing portion 44 drives the sliding part 50 move along A direction (shown in FIG. 2) to cover or uncover the receiving portions 14, synchronously, the securing portion 44 move in the receiving groove 540.

In this embodiment, the sliding part 50 defines a sliding groove 520. The bottom wall 12 comprises a sliding block 18 engageable with the sliding groove 520 to guide the sliding part 50 to move. The sliding groove 520 comprises a latching groove 523 and a receiving groove 524 in communication with each other. The sliding block 18 comprises a head portion 182 and a rod portion 184. The rod portion 184 connects between the head portion 182 and the inner surface 121 of the bottom wall 12. The head portion passes through the receiving groove 524 and then the rod portion 184 matches with the latching groove 523.

The sliding part 50 is snugly installed to an inner surface 121 of the bottom wall 12. The sliding part 50 comprises a base plate 52 contacting the inner surface 121 and a mounted portion 54 bent from the base plate 52 toward the operating wheel 40. The receiving groove 540 is defined in the mounted portion 54. The pair of openings 526 are defined in the base plate 54 respectively on two opposite sides of the mounted portion 54. The base plate 52 comprises a pair of blocking portion 522 respectively adjacent to the pair of openings 526 to cover or uncover the second receiving holes 144 of the pair of receiving portions 14. In a lockable position, as shown in FIG. 2, the blocking portions 522 block the second receiving holes 144, correspondingly. In an unlockable position, as shown in FIG. 3, the grooves 526 are superposed over the second receiving holes 144 of the receiving portions 14. The width D4 of each of the grooves 526 is greater than or equal to the width D3 of the corresponding second receiving hole 144, thereby the head 92 of the fastener 90 may pass through the corresponding groove 526.

The resilient member 60 is fixed between the bottom wall 12 and the operating wheel 40. In this embodiment, the bottom wall 12 comprises a first positioning post 17. The operating wheel 40 comprises a second position post 42. The resilient member 60 comprises two fixing ends 62, 64 respectively fixed to the first positioning post 17 and the second positioning post 42. The side wall 16 limits movement of the second position post 42 within the enclosure 10.

Rotatable movement of the operating wheel 40 relatively to the enclosure 10 cause the sliding part 50 to cover or uncover the pair of receiving portions 14, thereby the electronic device 100 being disposed between the lockable and the unlockable position. In the lockable position, the heads 92 of the fasteners 90 cannot be moved from the first receiving holes 142 to the second receiving holes 144, and the electronic device 100 is secured to the fasteners 90, avoiding damage or loss associated with accidental disengagement.

When the operating wheel 40 is rotated under an external force F put on the operating portion 41, the operating wheel 40 drives the sliding part 50 move along A direction, ultimately, the pair of openings 526 of the sliding part 50 are superposed on the receiving portions 14 respectively and the electronic device 100 is in the unlockable position. Therefore, electronic device 100 can be removed from or fixed to the fasteners 90. In the unlockable position, the resilient member 60 creates a resilient force to drive the sliding part 50 to move back to cover the pair of receiving portions 14.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising:
    an enclosure, comprising a bottom wall defining a pair of receiving portions and a sidewall defining a through hole; and
    a locking assembly, comprising:
        an operating wheel, pivotally connecting to the bottom wall and comprising an operating portion and a securing portion adjacent to a rim of the operating wheel and received in the enclosure, the operating portion passing through the through hole and exposed outside the enclosure;
        a sliding part, movably attached to the bottom wall and defining a receiving groove engaging with the securing portion and a pair of openings adjacent to the pair of receiving portions respectively; and
        a resilient member, fixed between the bottom wall and the operating wheel;
    wherein rotatable movement of the operating wheel relatively to the enclosure cause the sliding part to cover or uncover the pair of receiving portions, thereby the electronic device being disposed between a lockable and an unlockable position;
    wherein in the unlockable position, the pair of openings of the sliding part are superposed on the receiving portions respectively, and the resilient member creates a resilient force to drive the sliding part to move back to cover the pair of receiving portions.

2. The electronic device as recited in claim 1, wherein each of the receiving portions defines a first receiving hole and a second receiving hole in communication with the first receiving hole, in the lockable position the sliding part cover the second receiving holes.

3. The electronic device as recited in claim 2, wherein width of each of the pair of openings of the sliding part is greater than that of the corresponding second receiving hole.

4. The electronic device as recited in claim 1, wherein the sliding part defines a sliding groove, the bottom wall comprises a sliding block engageable with the sliding groove to guide the sliding part to move.

5. The electronic device as recited in claim 4, wherein the sliding groove comprises a latching groove and a receiving groove in communication with each other, the sliding block comprises a head portion passing through the receiving groove, so as to make the sliding block match with the latching groove.

6. The electronic device as recited in claim 1, wherein the sliding part is snugly installed to an inner surface of the bottom wall and comprises a base plate and a mounted portion bent from the base plate toward the operating wheel, the receiving groove is defined in the mounted portion, and the pair of openings are defined in the base plate.

7. The electronic device as recited in claim 6, wherein the base plate comprises a pair of blocking portions respectively adjacent to the pair of openings to cover or uncover the pair of receiving portions.

8. The electronic device as recited in claim 1, wherein the bottom wall comprises a first positioning post, the operating wheel comprises a second position post, the resilient member comprises two fixing ends respectively fixed to the first positioning post and the second positioning post.

9. The electronic device as recited in claim 1, wherein the bottom wall comprises a protruding rod perpendicularly extending from an inner surface of the bottom wall, the operating wheel defines a center through hole and a passing groove extending from the center through hole to the rim of the operating wheel, the protruding rod passes through the passing groove and eventually is positioned in the center through hole.

10. The electronic device as recited in claim 9, wherein the securing portion is adjacent to the passing groove.

* * * * *